(12) United States Patent
Egley et al.

(10) Patent No.: US 8,859,432 B2
(45) Date of Patent: Oct. 14, 2014

(54) BARE ALUMINUM BAFFLES FOR RESIST STRIPPING CHAMBERS

(71) Applicant: Lam Research Corporation, Fremont, CA (US)

(72) Inventors: Fred D. Egley, Sunnyvale, CA (US); Michael S. Kang, San Francisco, CA (US); Anthony L. Chen, Pleasanton, CA (US); Jack Kuo, Pleasanton, CA (US); Hong Shih, Walnut, CA (US); Duane Outka, Fremont, CA (US); Bruno Morel, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/665,225

(22) Filed: Oct. 31, 2012

(65) Prior Publication Data

US 2013/0056022 A1    Mar. 7, 2013

Related U.S. Application Data

(60) Division of application No. 12/873,906, filed on Sep. 1, 2010, now Pat. No. 8,313,635, which is a division of application No. 11/987,419, filed on Nov. 29, 2007, now Pat. No. 7,811,409, which is a continuation of application No. 10/874,566, filed on Jun. 24, 2004, now abandoned.

(51) Int. Cl.
| | |
|---|---|
| *H01L 21/461* | (2006.01) |
| *C03C 15/00* | (2006.01) |
| *C23F 1/00* | (2006.01) |

(52) U.S. Cl.
USPC ........... 438/725; 438/689; 438/706; 438/707; 438/710; 438/727; 26/41; 26/58; 26/67; 26/69; 156/345.35; 134/1.1; 134/1.2; 430/256

(58) Field of Classification Search
USPC ............... 216/41, 58, 63, 67, 69, 72, 81; 156/345.1–345.55; 118/715–733; 438/689, 706, 707, 710, 727; 134/1.1, 134/1.2
See application file for complete search history.

(56) References Cited

U.S. PATENT DOCUMENTS

| | | |
|---|---|---|
| 2,567,877 A | 9/1951 | De Ment |
| 3,766,030 A | 10/1973 | Greene |
| 3,970,529 A | 7/1976 | Martin |
| 5,268,034 A | 12/1993 | Vukelic |
| 5,366,585 A | 11/1994 | Robertson et al. |
| 5,411,607 A | 5/1995 | Basaly et al. |
| 5,478,415 A | 12/1995 | Massad et al. |
| 5,614,026 A | 3/1997 | Williams |

(Continued)

OTHER PUBLICATIONS

Official Action mailed Sep. 25, 2009 for Chinese Patent Appln. No. 200510079142.2.

(Continued)

*Primary Examiner* — Nadine Norton
*Assistant Examiner* — Christopher Remavege
(74) *Attorney, Agent, or Firm* — Buchanan Ingersoll & Rooney PC

(57) ABSTRACT

Bare aluminum baffles are adapted for resist stripping chambers and include an outer aluminum oxide layer, which can be a native aluminum oxide layer or a layer formed by chemically treating a new or used bare aluminum baffle to form a thin outer aluminum oxide layer.

13 Claims, 3 Drawing Sheets

(56) References Cited

U.S. PATENT DOCUMENTS

| | | |
|---|---|---|
| 5,792,672 A | 8/1998 | Chan et al. |
| 5,819,434 A | 10/1998 | Herchen et al. |
| 5,853,607 A | 12/1998 | Zhao et al. |
| 6,025,862 A | 2/2000 | Thompson |
| 6,080,680 A | 6/2000 | Lee et al. |
| 6,083,451 A | 7/2000 | Gupta et al. |
| 6,117,794 A * | 9/2000 | Dormer et al. ................. 438/745 |
| 6,182,603 B1 | 2/2001 | Shang et al. |
| 6,258,440 B1 | 7/2001 | Aihara et al. |
| 6,263,829 B1 | 7/2001 | Schneider et al. |
| 6,274,058 B1 | 8/2001 | Rajagopalan et al. |
| 6,352,050 B2 | 3/2002 | Kamarehi et al. |
| 6,362,110 B1 | 3/2002 | Marks |
| 6,372,084 B2 | 4/2002 | Hongo et al. |
| 6,461,974 B1 | 10/2002 | Ni et al. |
| 6,579,439 B1 | 6/2003 | Chandler |
| 6,635,117 B1 * | 10/2003 | Kinnard et al. ........... 118/723 R |
| 6,647,993 B2 | 11/2003 | Shang et al. |
| 6,693,043 B1 * | 2/2004 | Li et al. ........................ 438/725 |
| 6,821,347 B2 | 11/2004 | Carpenter et al. |
| 6,823,589 B2 | 11/2004 | White et al. |
| 6,827,815 B2 | 12/2004 | Hytros et al. |
| 6,844,082 B2 | 1/2005 | Tzeng et al. |
| 6,863,077 B2 | 3/2005 | Sun et al. |
| 7,048,814 B2 | 5/2006 | Lin et al. |
| 7,491,908 B2 * | 2/2009 | Iino .......................... 219/121.43 |
| 7,892,357 B2 * | 2/2011 | Srivastava .................... 118/715 |
| 8,313,635 B2 | 11/2012 | Egley et al. |
| 2001/0006070 A1 * | 7/2001 | Shang et al. ...................... 134/1 |
| 2003/0066607 A1 * | 4/2003 | White et al. ............. 156/345.34 |
| 2003/0077883 A1 | 4/2003 | Ohtake |
| 2003/0150530 A1 * | 8/2003 | Lin et al. ....................... 148/518 |
| 2004/0003777 A1 * | 1/2004 | Carpenter et al. ............ 118/715 |
| 2004/0103844 A1 | 6/2004 | Chou et al. |
| 2004/0238123 A1 * | 12/2004 | Becknell et al. ......... 156/345.33 |
| 2005/0056546 A1 | 3/2005 | Kia et al. |
| 2005/0284573 A1 | 12/2005 | Egley et al. |

OTHER PUBLICATIONS

Official Action mailed Jan. 22, 2010 for Chinese Patent Appln. No. 200510079142.2.

\* cited by examiner

BARE ALUMINUM BAFFLES FOR RESIST STRIPPING CHAMBERS

CROSS-REFERENCE TO RELATED APPLICATIONS

This application is a continuation of U.S. patent application Ser. No. 10/874,566 entitled BARE ALUMINUM BAFFLES FOR RESIST STRIPPING CHAMBERS, filed on Jun. 24, 2004, the entire content of which is hereby incorporated by reference.

BACKGROUND

Semiconductor substrate materials, such as silicon wafers, are processed by techniques including deposition processes, such as chemical vapor deposition (CVD) or plasma-enhanced chemical vapor deposition (PECVD) of metal, dielectric and semiconductor materials; etching processes; and resist stripping processes.

Semiconductor integrated circuit (IC) processes include forming devices on substrates. Conductive and insulating material layers are deposited on the substrates. Resist can be applied as a masking layer over the layer stack and patterned to protect portions of the underlying material where etching is not desired. After the etch process has been completed, the resist is removed from the structure by a stripping technique, such as using organic strippers, oxidizing-type strippers, or dry stripping by plasma etching.

SUMMARY

Bare aluminum baffles are provided, which are adapted for a resist stripping chamber of a plasma processing apparatus that includes a remote plasma source to supply reactive species into the resist stripping chamber. A preferred embodiment of the baffle is configured to be supported by a sidewall of the resist stripping chamber with a perforated surface of the baffle facing a semiconductor substrate to be processed in the chamber. The perforated surface of the baffle includes gas passages for distributing the reactive species.

The bare aluminum baffle includes an outer aluminum oxide layer forming an outer surface of the baffle. The outer layer preferably has a thickness of about 50 angstroms to about 300 angstroms, and preferably having a density of at least about 90% of the theoretical density of aluminum oxide. The outer aluminum oxide layer can be a native aluminum oxide layer, or it can be formed by chemically treating either a new or used bare aluminum baffle.

A preferred embodiment of a resist stripping apparatus comprises a resist stripping chamber; a remote plasma source operable to generate a plasma and introduce reactive species into the resist stripping chamber; and a bare aluminum baffle supported by a sidewall of the resist stripping chamber. The remote plasma source preferably includes a microwave generator that emits microwaves to excite a process gas into the plasma state.

A preferred embodiment of a method of stripping resist from a semiconductor substrate in a resist stripping chamber is provided, which comprises energizing a process gas into the plasma state remotely from the resist stripping chamber, and supplying reactive species into the resist stripping chamber in which a substrate including a resist is supported on a substrate support. The resist stripping chamber includes a sidewall and a bare aluminum baffle forming a top wall and being supported by the sidewall. The reactive species are distributed into the chamber through the passages in the baffle to remove the resist from the substrate.

A preferred embodiment of a method of treating a bare aluminum baffle adapted for a resist stripping chamber is provided, which comprises treating a bare aluminum baffle having a first outer aluminum oxide layer with a chemical solution effective to remove contaminants and the first outer aluminum oxide layer from the baffle to expose aluminum material; and forming a second outer aluminum oxide layer on the aluminum material. The second outer aluminum oxide layer preferably has a thickness of about 50 angstroms to about 300 angstroms, and preferably has a density of at least about 90% of the theoretical density of aluminum oxide.

DETAILED DESCRIPTION

Figure 1:
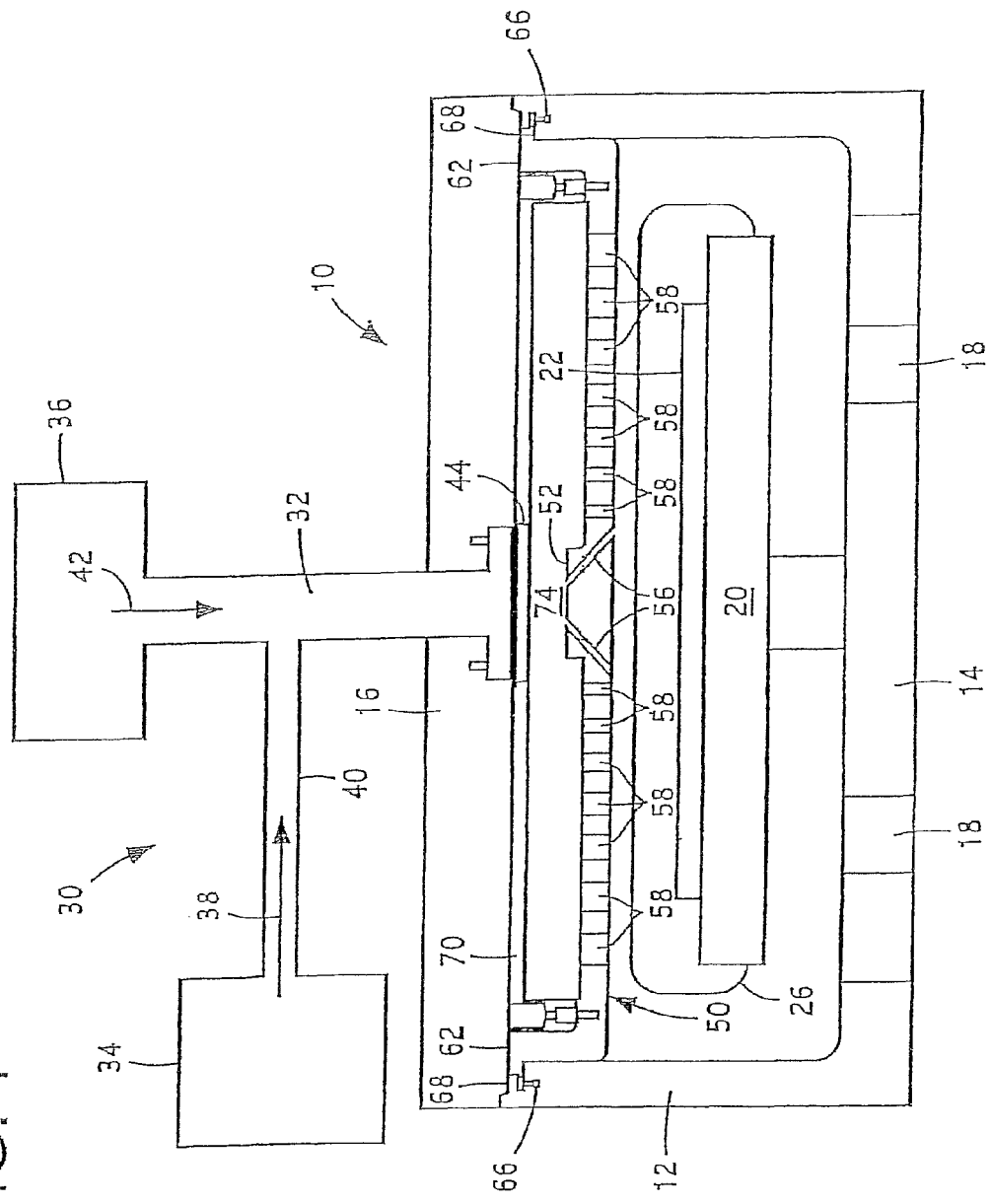
FIG. 1 depicts an embodiment of a resist stripping chamber including a preferred embodiment of the bare aluminum baffle.

Plasma processing apparatuses for semiconductor substrates, such as silicon wafers, include resist stripping chambers, which are used in semiconductor device manufacturing processes to remove resist (or "photoresist"), which is used as a mask for the semiconductor structures. For example, resist is removed from underlying layers after one or more of the layers have been etched to form features in them. One technique that is performed in resist stripping chambers to remove resist from semiconductor structures is dry stripping, also referred to as "ashing," which uses plasma dry etching techniques.

During a resist stripping operation, reactive species are distributed over a substrate including a resist layer, which is being processed inside the resist stripping chamber. It has been found that baffles of materials including anodized aluminum, and ceramics, such as quartz, silicon carbide and sapphire have certain disadvantages. Anodized aluminum baffles include an outer oxide coating formed by the anodic oxidation of aluminum materials in an electrolyte. However, anodized layers formed by anodizing processes include an inner layer and an outer layer, which can be undesirably porous, of low density and include defects. Also, anodized layers are thick, typically having a thickness of about 5,000 to 10,000 angstroms.

It has also been found that baffles of ceramic materials have low thermal conductivity, making them prone to thermal shock failure during semiconductor substrate processing, and also causing them to have poor spatial temperature uniformity during resist stripping, which reduces the uniformity of resist removal from substrates. Ceramic baffles also are brittle and, consequently, subject to breakage even during routine cleaning and handling operations. Further, quartz baffles are consumable parts; i.e., their performance in resist stripping chambers degrades with continued service.

In light of the above-described disadvantages associated with using baffles of anodized aluminum and ceramic materials in resist stripping chambers, further investigations have been conducted to develop baffles of different materials for use in resist stripping chambers. As a result of these investigations, it has unexpectedly been determined that baffles of "bare aluminum" can be used in resist stripping chambers without the above-mentioned disadvantages of baffles of anodized aluminum and ceramic materials. As used herein, the term "bare aluminum" means an aluminum or aluminum alloy material that has a "native" outer oxide layer, or such an aluminum or aluminum alloy material with a thin outer aluminum oxide layer formed by an embodiment of the methods described herein. As described herein, a "thin" outer aluminum oxide layer preferably has a thickness of about 50 angstroms to about 300 angstroms, more preferably about 50 angstroms to about 100 angstroms. Native aluminum oxide layers form naturally on aluminum materials when they are exposed to an oxygen-containing atmosphere at ambient temperature. The term "bare aluminum" as used herein does not include anodized aluminum materials including an anodized aluminum oxide layer.

FIG. 1 depicts an exemplary embodiment of a resist stripping chamber 10 in which a preferred embodiment of the bare aluminum baffle 50 is mounted. The resist stripping chamber 10 includes a side wall 12, a bottom wall 14 and a cover 16. The walls 12, 14 and the cover 16 of the resist stripping chamber 10 can be of any suitable material, such as anodized aluminum, or bare aluminum. The cover 16 is preferably pivotably attached by hinges to the side wall 12 to allow the cover 16 to be opened to access the interior of the resist stripping chamber 10 to remove the bare aluminum baffle 50 for cleaning or replacement, or for other purposes. The resist stripping chamber 10 includes vacuum ports 18 in the bottom wall 14.

The resist stripping chamber 10 also includes a substrate support 20 on which a semiconductor substrate 22, such as a wafer, is mounted during resist stripping. The substrate 22 includes a resist that provides a masking layer for protecting underlying layers of the substrate 22 during the resist stripping process. The underlying layers can be of conductive, insulative and/or semiconductive materials. The substrate support 20 preferably comprises an electrostatic chuck adapted to clamp the substrate 22. The substrate support 20 preferably includes a heater, such as a resistive heating element, adapted to maintain the substrate 22 at a suitable temperature during the resist stripping process, preferably from about 200° C. to about 300° C., more preferably from about 250° C. to about 300° C. The substrate 22 can be introduced into and removed from the resist stripping chamber 10 through a substrate entry port 26 provided in the sidewall 12. For example, the substrate 22 can be transferred under vacuum into the interior of the resist stripping chamber 10 from an etching chamber located proximate the resist stripping chamber.

In the embodiment, a remote plasma source 30 is arranged in fluid communication with the resist stripping chamber 10. The plasma source 30 is operable to produce plasma and to supply reactive species into the interior of the resist stripping chamber 10 through a passage 32 connected to the resist stripping chamber 10. The reactive species remove resist from the substrate 22 supported on the substrate support 20. The illustrated embodiment of the plasma source 30 includes a remote energy source 34 and a stripping gas source 36. The energy source 34 can be any suitable source and is preferably a microwave generator. Exemplary apparatuses including a microwave generator are available from Lam Research Corporation located in Freemont, Calif. In a preferred embodiment, the microwave generator operates at a frequency of 2.45 GHz, and preferably has a power in the range of about 500 to about 1500 W, more preferably in the range of about 1000 to about 1500 W. Microwaves, represented by arrow 38, are produced by the microwave generator 34 and propagated through a waveguide 40 into the passage 32.

The gas source 36 is operable to supply process gas, represented by arrow 42, into the passage 32, where the gas is energized into the plasma state by the microwaves produced by the energy source 34. Reactive species pass through an opening 44 into the interior of the resist stripping chamber 10.

The reactive species are distributed in the resist stripping chamber 10 by a bare aluminum baffle 50 located between the cover 16 and the substrate support 20 before the reactive species flow onto the substrate 22 and strip the resist. The substrate 22 is preferably heated by a heater located in the substrate support 20 during resist stripping. Waste products generated during resist stripping are pumped out of the resist stripping chamber 10 through the exhaust ports 18.

Figure 2:
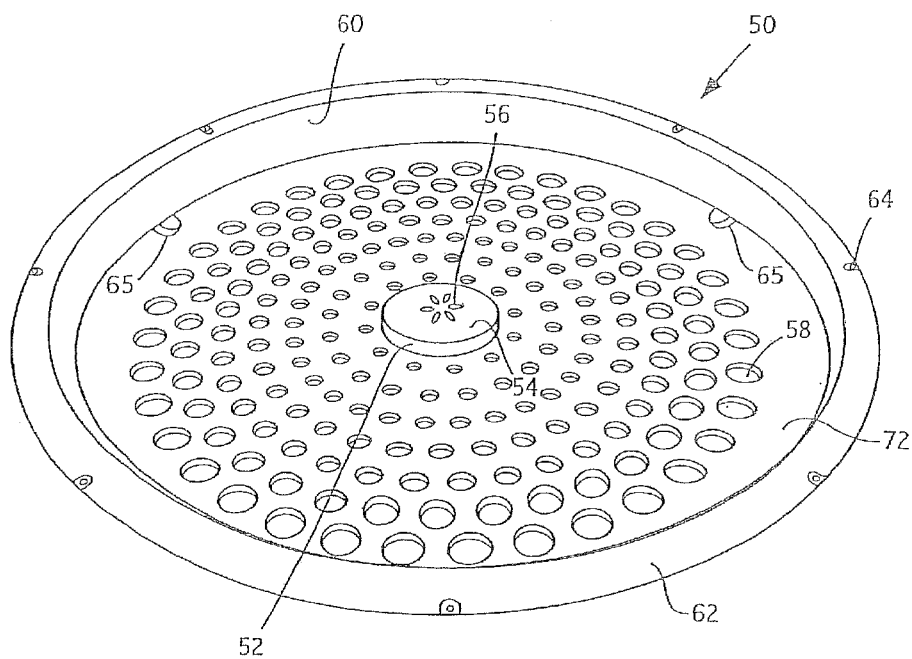
FIG. 2 illustrates a preferred embodiment of the bare aluminum baffle.
Figure 3:
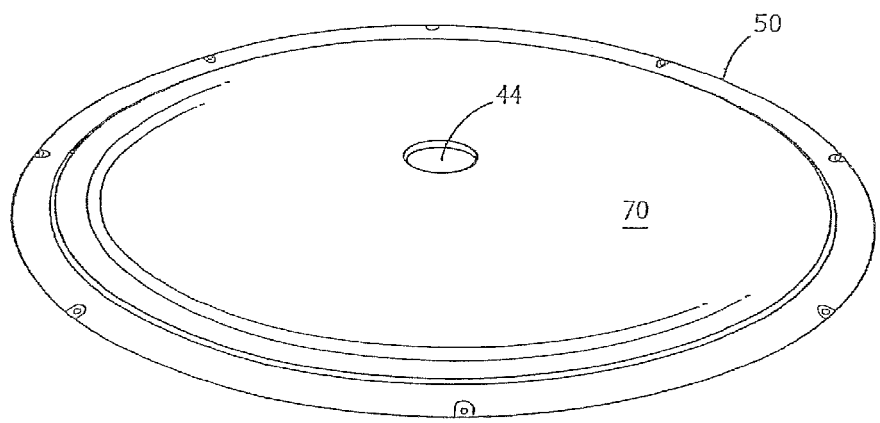
FIG. 3 illustrates a liner positioned on the bare aluminum baffle shown in FIG. 2.

As shown in FIG. 2, the bare aluminum baffle 50 is preferably a circular, one-piece body of bare aluminum. The resist stripping chamber 10 is preferably cylindrical for single wafer processing. When adapted to be installed in a cylindrical resist stripping chamber 10, the bare aluminum baffle 50 preferably has a diameter larger than the width, e.g., diameter, of the interior of the resist stripping chamber 10 so that the baffle can be supported by the side wall 12. The bare aluminum baffle 50 includes an inner portion having a raised central portion 52 with an upper surface 54 and through passages 56. In the illustrated embodiment of the bare aluminum baffle 50, the central portion 52 includes six circumferentially spaced-apart passages 56. The number of passages 56 can be either more or less than six in other embodiments. In the embodiment, ultraviolet (UV) radiation that passes through the passage 32 impinges on the upper surface 54 in a direction generally perpendicular to the upper surface. The passages 56 are preferably oriented at an acute angle relative to the upper surface 54 to prevent a direct line of sight for the UV radiation to pass through the bare aluminum baffle 50. Consequently, the UV radiation is reflected from the upper surface 54 and the walls of the passages 56 so that it does not damage the substrate 22.

The bare aluminum baffle 50 also includes through passages 58 arranged between the central portion 52 and a peripheral portion 60. The passages 58 are adapted to distribute reactive species in a desired flow pattern into the interior of the resist stripping chamber 10. As shown in FIG. 2, the passages 58 preferably are in the form of concentrically-arranged rows of holes. The passages 58 preferably have a round cross section and preferably increase in cross-sectional size (e.g., diameter) in the radial outward direction of the bare aluminum baffle 50 from the central portion 52 toward the peripheral portion 60.

As shown in FIG. 2, the peripheral portion 60 of the bare aluminum baffle 50 includes a flange 62 having circumferentially spaced-apart holes 64 for receiving fasteners 66, e.g., threaded bolts (FIG. 1), to attach the bare aluminum baffle 50 to the top surface 68 of the side wall 12 of the resist stripping chamber 10. The bare aluminum baffle 50 can be detached from the side wall 12 and removed from the resist stripping chamber 10 to treat or replace the bare aluminum baffle, as desired.

The bare aluminum baffle 50 is of aluminum or an aluminum alloy, such as 6061 aluminum, which comprises by weight from about 96 to about 99% Al, about 0.8 to about 1.2% Mg, about 0.4 to about 0.8% Si, Cu, Cr, and optionally Fe, Mn, Zn and/or Ti.

A liner 70 is adapted to be supported on the upper surface 72 of the bare aluminum baffle 50 to minimize the deposition of materials on the bottom surface of the cover 16 during resist stripping processes. Circumferentially spaced-apart spacers 65 are provided on the upper surface 72 to support the liner 70 and form a plenum 74 therebetween (FIG. 1). The spacers 65 can be of any suitable material, and are preferably of "TEFLON." The liner 70 includes a centrally located passage 44 through which reactive species pass from the passage 32 into the plenum 74. The liner 70 is preferably made of bare aluminum, such as 6061 aluminum.

The bare aluminum baffle 50 can be a "new" baffle that has not been used in a resist stripping chamber and includes a native aluminum oxide outer layer, or a "used" baffle, i.e., a baffle that has been previously used in a resist stripping chamber and includes either a native outer aluminum oxide layer or a thin outer aluminum oxide layer formed by an embodiment of the methods described herein. Such "new" and "used" bare aluminum baffles can be treated by the methods described herein to produce a thin outer aluminum oxide layer. In other words, "used" bare aluminum baffles can be recovered by performing the methods described herein. "Recovered" bare aluminum baffles including a thin outer aluminum oxide layer can be reinstalled in resist stripping chambers and reused for resist stripping processing.

As explained above, new bare aluminum baffles including a native outer aluminum oxide layer can be used in resist stripping chambers. The native outer aluminum oxide layer preferably has a thickness of from about 25 to about 75 angstroms. Before new bare aluminum baffles are installed in a resist stripping chamber, they are preferably treated to remove residual contaminants, such as lubricants, resulting from the manufacturing of the baffles.

According to another preferred embodiment of the bare aluminum baffles, new bare aluminum baffles that include a native outer aluminum oxide layer can be treated by removing the native outer aluminum oxide layer, thereby leaving only the aluminum base material; and then forming a thin outer aluminum oxide layer on the exposed surface of the aluminum material. The native outer aluminum oxide layer is removed if it is determined to have insufficient properties for use in a resist stripping chamber, e.g., the native outer aluminum oxide layer has an insufficient density, thickness and/or uniformity. The outer aluminum oxide layer formed after removing the native outer aluminum oxide layer preferably is a single layer; preferably has a thickness of about 50 angstroms to about 300 angstroms, more preferably about 50 angstroms to about 100 angstroms; and preferably has a density of at least about 90%, more preferably at least about 95%, of the theoretical density of aluminum oxide. Accordingly, the thin aluminum oxide layer has reduced porosity than anodized aluminum oxide layers. Also, thick anodized aluminum oxide layers can include undesirable intermetallic inclusions, such as SiMg or MgSiFe, which reduce their quality.

According to another preferred embodiment of the bare aluminum baffles, used bare aluminum baffles that include a native outer aluminum oxide layer can be recovered by a treatment process that includes steps of removing surface contaminants and the native outer aluminum oxide layer from the baffle, thereby leaving only the aluminum base material; and then forming a thin outer aluminum oxide layer on the exposed surface of the aluminum base material. The outer aluminum oxide layer preferably is a single layer; preferably has a thickness of about 50 angstroms to about 300 angstroms, more preferably about 50 angstroms to about 100 angstroms; and preferably has a density of at least about 90%, more preferably at least about 95%, of the theoretical density of aluminum oxide.

According to another preferred embodiment, used bare aluminum baffles that include a thin outer aluminum oxide layer formed by embodiments of the methods described herein can be treated to remove contaminants on the outer aluminum oxide layer and also to remove the outer aluminum oxide layer itself, and then to form a new outer aluminum oxide layer on the resulting aluminum base material. This treatment can be performed when desirable, thereby allowing the as-treated bare aluminum baffle to be re-used in a resist stripping chamber. For example, the treatment can be performed when it is determined that there has been a reduction in the resist strip rate, strip non-uniformity across the wafer, and/or the occurrence of particle deposition on substrates processed in the resist stripping chamber containing the bare aluminum baffle. The treatment can be performed one or more times, i.e., the bare aluminum baffle can be recovered at least once.

In another preferred embodiment, the bare aluminum baffle including the as-formed aluminum oxide layer can be post-treated to remove micro-contaminants, particles and defects from the aluminum oxide layer.

According to a preferred embodiment, new and used bare aluminum baffles are treated by a chemical treatment process that includes removing surface contaminants and the native aluminum oxide layer from new or used bare aluminum baffles, or a previously-formed thin aluminum oxide layer and contaminants from used bare aluminum baffles. A thin aluminum oxide layer is formed on the aluminum base material after the aluminum oxide layer is removed. Depending on various factors including the composition of the resist, the composition of the layers of the substrate, and the process gas mixture used for stripping resist from the substrate, contaminants deposited on the exposed surface of the bare aluminum baffle can include, for example, carbon, Ti, $TiF_4$ and $AlF_3$. The chemical treatment process comprises steps of removing surface contaminants and the native or previously-formed thin outer aluminum oxide layer to expose the aluminum base material, and then forming a thin aluminum oxide layer on the aluminum base material. The chemical treatment process preferably also includes steps of refinishing the surface of the aluminum base after removing the aluminum oxide layer, and treating the refinished surface of the bare aluminum baffle to remove contaminants prior to forming the thin aluminum oxide layer.

According to a preferred embodiment of the chemical treatment process, a new or used bare aluminum baffle is initially cleaned to remove deposits. Such deposits can include organics from stripping photoresist from substrates, as well as other substances, such as Ti, $TiF_4$ and $AlF_3$. The cleaning preferably includes first using a suitable alkaline cleaning solution, such as Nova 120 solution available from Henkel Surface Technologies located in Madison Heights, Mich. This solution is a non-silicated, alkaline cleaning solution containing sodium tetraborate and proprietary additives. The bare aluminum baffle is preferably immersed in the solution for about 5 to about 15 minutes at a temperature of about 110° F. to about 130° F., followed by rinsing with the bare aluminum baffle with water for about 3 to about 5 minutes to remove the solution from it.

In the embodiment, the bare aluminum baffle outer surface preferably is then etched using a suitable alkaline etching solution, such as Nova SC603B solution available from Henkel Surface Technologies. This solution is an alkaline etching solution containing primarily sodium hydroxide and proprietary additives. The bare aluminum baffle is preferably immersed in the solution for about 30 seconds to about 2 minutes at a temperature of about 110° F. to about 130° F., followed by rinsing with water for a sufficient amount of time to remove the solution from the bare aluminum baffle, typically about 5 minutes to about 10 minutes. The rinsing water is preferably ultrapure water having a resistivity of at least about 15 Mohm-cm at about ambient temperature.

In the embodiment, the outer surface of the bare aluminum baffle is then de-oxidized using a suitable solution, such as Nova 310A & B solution available from Henkel Surface Technologies. The bare aluminum baffle is preferably immersed in the solution for a sufficient amount of time to remove the outer aluminum oxide layer from the bare aluminum baffle, typically from about 5 to about 10 minutes. The solution is preferably at about ambient temperature. The bare aluminum baffle is then rinsed, preferably with ultrapure water, for a sufficient amount of time to remove the solution, typically about 5 to about 10 minutes. The rinsed bare aluminum baffle is dried using, for example, clean dry air or filtered nitrogen.

After removing the aluminum oxide layer, the bare aluminum baffle preferably is refinished to form a desired surface roughness for use in the resist stripping chamber. For example, the refinished surface roughness can be about 15 to about 20 microinches. The bare aluminum baffle can be refinished using any suitable abrasive, such as abrasive paper including an aluminum oxide abrasive, e.g., a 220-grit abrasive paper. Coarser or finer abrasive paper can also, or alternatively, be used depending the desired surface finish of the bare aluminum baffle. The bare aluminum baffle can be rotated during resurfacing to enhance the uniformity of the surface finish. The resurfaced bare aluminum baffle is rinsed, preferably using ultrapure water, for a sufficient amount of time to remove loose particles from the bare aluminum baffle surface, typically about 5 to 10 minutes. The rinsed bare aluminum baffle is dried using, for example, clean dry air or filtered nitrogen.

In the embodiment, contaminants remaining on the bare aluminum baffle surface from the refinishing are removed; preferably first using a suitable alkaline cleaning solution, such as Nova 120. The bare aluminum baffle is preferably soaked in the solution for about 5 to about 15 minutes at a temperature of about 110° F. to about 130° F. The bare aluminum baffle is then rinsed, preferably with ultrapure water for about 3 to about 10 minutes, to remove residual alkaline cleaning solution from the bare aluminum baffle.

After the alkaline cleaning step, the bare aluminum baffle is cleaned with an acid cleaning solution to form an aluminum oxide layer on the bare aluminum baffle, which following the completion of this step will continue to grow in air. Any suitable acid cleaning solution can be used. A preferred acid cleaning solution contains a mixture of about 0.25% phosphoric acid and about 0.05% hydrofluoric acid. The bare aluminum baffle is preferably immersed in an acid cleaning solution for about 1 to about 3 minutes at about ambient temperature. The bare aluminum baffle is then rinsed, preferably with ultrapure water for about 3 to 10 minutes, to remove residual acid cleaning solution from the bare aluminum baffle.

In the embodiment, the bare aluminum baffle is preferably then ultrasonically cleaned in ultrapure water in a suitable clean environment, preferably a class 1000 clean room. The water is preferably at about ambient temperature. After ultrasonic cleaning, the bare aluminum baffle is preferably rinsed with ultrapure water and then dried using, for example, clean dry air or filtered nitrogen.

In another preferred embodiment, new and/or used bare aluminum baffles can be treated by a process that includes removing surface contaminants and either a native outer aluminum oxide layer or a previously formed thin outer aluminum oxide layer, and then forming a thin outer aluminum oxide layer on the bare aluminum baffle by an electropolishing procedure. In the embodiment, the contaminants and outer aluminum oxide layer can be removed by the steps described above.

After the outer aluminum oxide layer has been removed from the bare aluminum baffle to expose the aluminum base material, the bare aluminum baffle is electropolished by placing the bare aluminum baffle in an electropolishing tank containing a suitable acid solution, preferably containing at least phosphoric acid. The electropolishing conditions can be selected to produce an aluminum oxide layer having a desired thickness, preferably from about 50 to about 100 angstroms. The aluminum oxide layer preferably has a density of at least about 90%, more preferably at least about 95%, of the theoretical density of aluminum oxide. Typically, the electropolishing can be conducted for about 30 seconds to about 5 minutes to produce an aluminum oxide layer of the desired thickness.

In the embodiment, the bare aluminum baffle having an outer aluminum oxide layer is preferably rinsed in deionized water and ultrasonically cleaned in ultrapure water in a clean environment, such as a class 10,000 or 1000 clean room. The bare aluminum baffle is then dried, preferably using nitrogen or ultrapure air.

Bare aluminum baffles having a native aluminum oxide outer layer or a thin aluminum oxide outer layer formed by preferred embodiments of the methods described above can be used in resist stripping chambers without causing metallic contamination of substrates, such as semiconductor wafers, reduced resist stripping rates, or reduced resist strip uniformity. The bare aluminum baffles can provide resistance to oxidation and/or erosion by etch process gases, including fluorinated gases.

The bare aluminum baffles can provide certain advantages as compared to baffles of ceramic materials and anodized aluminum. Particularly, the bare aluminum baffles have higher thermal conductivity than ceramic baffles, which can eliminate thermal shock problems and provide better temperature uniformity in the bare aluminum baffles, which in turn can improve resist strip uniformity on substrates. Aluminum is also less expensive than high-purity ceramic materials. As compared to anodized aluminum baffles, the bare aluminum baffles have an outer aluminum oxide layer, which is a single layer, and which is thinner and of higher density than the anodized layers of such anodized aluminum baffles.

Figure 4:
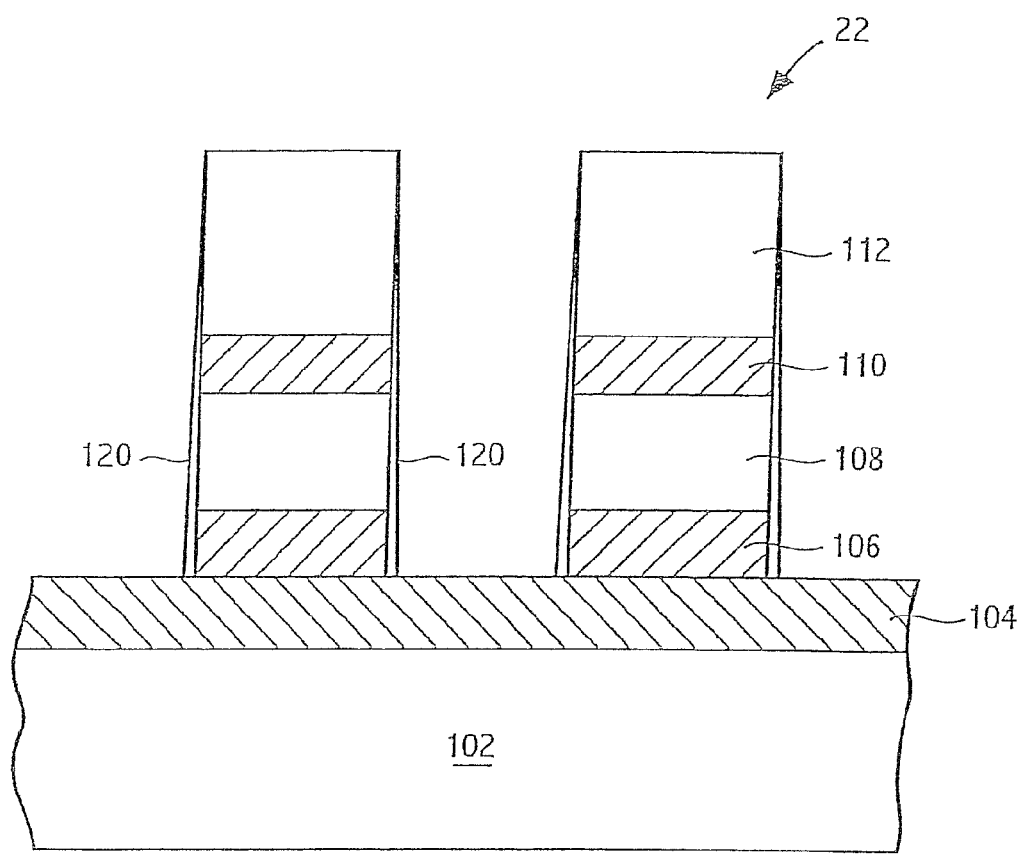
FIG. 4 illustrates an embodiment of a substrate that can be processed in the resist stripping chamber shown in FIG. 1.

An exemplary embodiment of a substrate 22 that can be processed in the resist strip chamber 10 is shown in FIG. 4. The substrate 22 is depicted after metal etching has been completed, but before resist stripping has been performed. In other embodiments, other layers can be provided above, below or between the layers shown. Further, not all of the layers shown in FIG. 4 need be present and some or all may be substituted by other different layers.

The substrate 22 includes a base substrate 102, typically of silicon. An oxide layer 104, such as $SiO_2$, is formed on the substrate 102. One or more barrier layers 106 of, e.g., Ti, TiN, TiW or the like, can be formed between the oxide layer 104 and an overlying metal layer 108.

The metal layer 108 can comprise, e.g., tungsten, aluminum or an aluminum alloy, such as Al—Cu, Al—Si, or Al—Cu—Si. The substrate 22 also can include an antireflective coating (ARC) layer 110 of any suitable material, such as TiN or TiW. A patterned resist layer 112 is provided over the ARC layer 110. Processing byproducts 120 are shown on the walls.

The process gas used to form the remote plasma includes oxygen, which is excited into a plasma state that dissociates $O_2$ into oxygen radicals and ion species, which are flowed into the interior of the resist stripping chamber 10 and react with (i.e., oxidize or "ash") the resist layer 112 on the substrate 22. The rate at which the photoresist is removed by the strip process is referred to as the "strip rate." The process gas can have any suitable composition, such as an oxygen-containing gas mixture, such as an $O_2/N_2$, $O_2/H_2O$, $O_2/N_2/CF_4$, or $O_2/N_2/H_2O$ gas mixture. The gas mixture preferably comprises $O_2$, $N_2$, and a fluorine-containing component, such as $CF_4$ or $C_2F_6$. $N_2$ can be added to the gas mixture to enhance selectivity with respect to the photoresist material as compared to a second material, such as a barrier and/or underlying material. As used herein, the term "selectivity" with respect to photoresist material as compared to a second material is defined as the ratio of the photoresist etch rate to the etch rate of the second material.

Preferred gas mixtures can contain, for example, by total gas volume, from about 40% to about 99%, preferably from about 60% to about 95%, and more preferably from about 70% to about 90% $O_2$; from about 0.5% to about 30%, preferably from about 2.5% to about 20%, and more preferably from about 5% to about 15% of fluorine-containing gas; and from about 0.5% to 30%, preferably about 2.5% to 20%, and more preferably about 5 to 15% of $N_2$. During resist stripping, the total flow rate of the process gas is preferably in the range of from about 500 to about 6000 sccm, more preferably from about 2000 to about 5000 sccm, and the pressure in the resist stripping chamber 10 is preferably in the range of about 200 mTorr to about 10 Torr.

The present invention has been described with reference to preferred embodiments. However, it will be readily apparent to those skilled in the art that it is possible to embody the invention in specific forms other than as described above without departing from the spirit of the invention. The preferred embodiment is illustrative and should not be considered restrictive in any way. The scope of the invention is given by the appended claims, rather than the preceding description, and all variations and equivalents which fall within the range of the claims are intended to be embraced therein.

What is claimed is:

1. A method of stripping resist from a substrate in a resist stripping chamber, the method comprising:
   energizing a process gas into the plasma state remotely from the resist stripping chamber and supplying reactive species into the resist stripping chamber in which a semiconductor substrate including a resist is supported on a substrate support, the resist stripping chamber including a sidewall and a bare aluminum baffle supported by the sidewall and forming a top wall of the resist stripping chamber; and
   distributing the reactive species onto the substrate through gas passages in the baffle so as to remove the resist from the substrate,
   wherein the bare aluminum baffle comprises a lower surface, an inner portion and a peripheral portion, wherein the inner portion includes a central projection comprising a portion of the bare aluminum baffle having a thickness greater than the peripheral portion and a plurality of concentrically arranged rows of the gas passages surrounding the central projection, the central projection includes an upper surface and a plurality of through passages extending from the upper surface to the lower surface and oriented at an acute angle relative to the upper surface such that the through passages extend in radial outward directions toward the peripheral portion, and the peripheral portion includes a flange having holes adapted to receive fasteners to attach the baffle to the sidewall.

2. The method of claim 1, wherein the bare aluminum baffle is a one-piece body.

3. A method of stripping resist from a substrate in a resist stripping chamber, the method comprising:
   energizing a process gas into the plasma state remotely from the resist stripping chamber and supplying reactive species into the resist stripping chamber in which a plasma-etched semiconductor substrate including a resist is supported on a substrate support, the resist stripping chamber including a sidewall and a bare aluminum baffle supported by the sidewall and forming a top wall of the resist stripping chamber; and
   distributing the reactive species onto the substrate through gas passages in the baffle so as to remove the resist from the substrate,
   wherein the baffle comprises an outer aluminum oxide layer having a thickness of about 50 angstroms to about 300 angstroms and a density of at least about 90% of the theoretical density of aluminum oxide.

4. The method of claim 3, wherein the outer aluminum oxide layer has a thickness of about 50 angstroms to about 75 angstroms.

5. The method of claim 3, wherein the outer aluminum oxide layer has a thickness of about 50 angstroms to about 100 angstroms and a density of at least about 95% of the theoretical density of aluminum oxide.

6. The method of claim 3, wherein the bare aluminum baffle is adapted to support a bare aluminum liner on a plurality of liner supports on an upper surface of the bare aluminum baffle such that the liner is adjacent to a cover of the resist stripping chamber and a plenum is defined between a bottom surface of the liner and an upper surface of the bare aluminum baffle when the bare aluminum baffle is supported on the side wall, the plenum being in fluid communication with the remote plasma source and the resist stripping chamber.

7. The method of claim 3, wherein the bare aluminum baffle is of an aluminum alloy.

8. The method of claim 3, wherein the bare aluminum baffle is circular shaped and has a diameter which is larger than a width of the interior of the resist stripping chamber so that a peripheral portion of the baffle overlies the side wall when the baffle is supported on the side wall of the resist stripping chamber.

9. The method of claim 3, wherein a microwave generator emits microwaves to excite the process gas into the plasma state.

10. The method of claim 3, wherein the process gas comprises oxygen and fluorine.

11. The method of claim 3, wherein the process gas consists of an $O_2$ plus $N_2$, $O_2$ plus $H_2O$, or $O_2$ plus $N_2$ and $H_2O$ gas mixture.

12. The method of claim 3, wherein the outer aluminum oxide layer is formed by an electropolishing procedure.

13. The method of claim 3, further comprising subjecting the substrate to a plasma etching process in an etching chamber and transferring the substrate into the resist stripping chamber.

* * * * *